United States Patent [19]

Someno

[11] 4,223,406
[45] Sep. 16, 1980

[54] MULTI BAND RADIO RECEIVER SYSTEM WITH PHASE LOCKED LOOP

[75] Inventor: Noboru Someno, Tokyo, Japan

[73] Assignee: Sony Corporation, Tokyo, Japan

[21] Appl. No.: 7,571

[22] Filed: Jan. 29, 1979

[30] Foreign Application Priority Data

Jan. 30, 1978 [JP] Japan .................................. 53-9137

[51] Int. Cl.³ .............................................. H04B 1/26
[52] U.S. Cl. .................................. 455/180; 455/182; 455/183
[58] Field of Search ............... 325/335, 453, 459, 464, 325/468, 470, 458; 331/16; 455/165, 169, 179, 180, 183, 184, 185, 186

[56] References Cited

U.S. PATENT DOCUMENTS

| | | | |
|---|---|---|---|
| 3,713,040 | 1/1973 | Page, Jr. | 331/16 |
| 3,753,142 | 8/1973 | Nardin et al. | 331/16 |
| 3,961,261 | 6/1976 | Pflasterer | 325/459 |
| 4,024,476 | 5/1977 | Briggs | 325/459 |
| 4,097,810 | 6/1978 | Aschwanden | 325/464 |
| 4,110,694 | 8/1978 | Wilhelm | 325/464 |
| 4,121,162 | 10/1978 | Alberkrack et al. | 325/459 |

*Primary Examiner*—Marc E. Bookbinder
*Attorney, Agent, or Firm*—Lewis H. Eslinger; Alvin Sinderbrand

[57] ABSTRACT

A multi band radio employs frequency counters to determine a scaling factor during coarse tuning which is employed in a phase locked loop to control the frequency of a local oscillator during normal operation. Frequency counters count the frequency in the phase locked loop and in a low variable frequency generator to determine the rf frequency to which the receiver is tuned. Read only memories provide band and frequency displays with control signals based on the counted frequencies.

19 Claims, 5 Drawing Figures

MULTI BAND RADIO RECEIVER SYSTEM WITH PHASE LOCKED LOOP

BACKGROUND OF THE INVENTION

1. Field of the Invention

This invention relates to a multi-band radio receiver employing a phase locked loop, and more particularly, to a multi band radio receiver in which coarse tuning is accomplished by disabling a phase locked loop and adjusting a coarse tuning reactance, deriving from the frequency generated during coarse tuning a scale factor and employing the scale factor in the phase locked loop during normal operation to control the frequency.

2. Description of the Prior Art

Prior art multi band radio receivers employ variable inductance and/or capacitance elements which are mechanically varied to adjust the oscillating frequency of a local oscillator to tune an rf signal. In receivers having a wide tuning range, for example, from 0.1-30 MHz, problems of stability and band spread exist which are not satisfactorily solved in the prior art.

Stability problems in prior art devices arise principally due to the necessary use of inductance and capacitance elements in frequency determining components. Minor vibration or flexing of the receiver structure is sufficient to vary the reactance of these elements which result in variations in the local oscillator frequency and consequently the frequency to which the receiver is tuned. In addition, frequency determining components of this type tend to drift with temperature and age thereby providing an additional source of instability.

Band spread problems occur due to the wide frequency band which multi band receivers must tune. For example, at low frequencies a relatively large tuning adjustment of a variable capacitance or inductance is required to change the frequency a given amount. At high frequencies, the size of the tuning adjustment required between stations decreases drastically. The amount of tuning adjustment decreases so much, in fact, that it becomes virtually impossible to accurately tune a station at high frequencies using a control that is also satisfactory for low frequencies. In response to this problem, prior art multi band receivers are provided with a coarse tuning control and a fine or band spread tuning control. The coarse tuning control is used to set the reactance of a relatively large inductor or capacitor to control the tuning at low frequencies but merely to establish the general tuning region at high frequencies. The fine tuning control employs a relatively small variable reactance which varies the tuning frequency a relatively small amount about the general tuning region established by the coarse tuning reactance.

In an attempt to achieve higher frequency stability, phase locked loops have been employed to control the local oscillator of prior art receivers. However, such phase locked loops have a limited tuning range of, for example, about 10 KHz. Thus a medium or short-wave band receiver employing such a phase locked loop requires phase locking at increments of for example 10 KHz. This then requires a very large number of locked frequencies and results in a complicated and high cost receiver which is difficult to use.

OBJECTS AND SUMMARY OF THE INVENTION

It is an object of this invention to provide a multi band radio frequency free from the defects of the prior art.

It is another object of this invention to provide a multi band radio receiver which permits continuous tuning over a wide frequency range.

It is a further object of this invention to provide a multi band radio receiver employing a local oscillator whose frequency can be locked to a phase locked loop.

It is still a further object of this invention to provide digital scaling in a phase locked loop which determines the local oscillator frequency in order to extend the frequency range which can be covered by the phase locked loop.

According to an aspect of the invention, apparatus is provided for producing a variable local oscillator frequency signal for use in a radio receiver which comprises: phase locked loop means having an oscillator therein for generating the variable local oscillator frequency signal, scaler means in the phase locked loop means for dividing the frequency of a signal having a frequency related to the frequency of the local oscillator frequency signal by a changeable scale factor to produce a scaled frequency signal, error signal generating means for generating an error signal in proportion to the phase error between the scaled frequency signal and a reference signal, and scale factor determining means for producing the changeable scale factor in relation to the frequency of the signal having a frequency related to the frequency of the local oscillator frequency signal.

According to a feature of the invention, there is provided apparatus for producing a variable local oscillator frequency signal for use in a radio receiver which comprises: controllable means for generating a variable frequency signal, phase locked loop means for generating the variable local oscillator frequency signal, mixer means in the phase locked loop means for mixing signals related to the variable frequency signal and the variable local oscillator signal to produce a third frequency signal, scaler means in the phase locked loop means for dividing the third frequency signal by a changeable scale factor to produce a fourth frequency signal, error signal generating means in the phase locked loop means for generating an error signal in response to the fourth frequency signal varying from a reference frequency, and scale factor determining means for producing the changeable scale factor in relation to at least one of the frequencies of the variable frequency signal and the third frequency signal.

The above, and other objects, features and advantages of the present invention will become apparent from the following description read in conjunction with the accompanying drawings.

DETAILED DESCRIPTION OF THE PREFERRED EMBODIMENT

Figure 1:
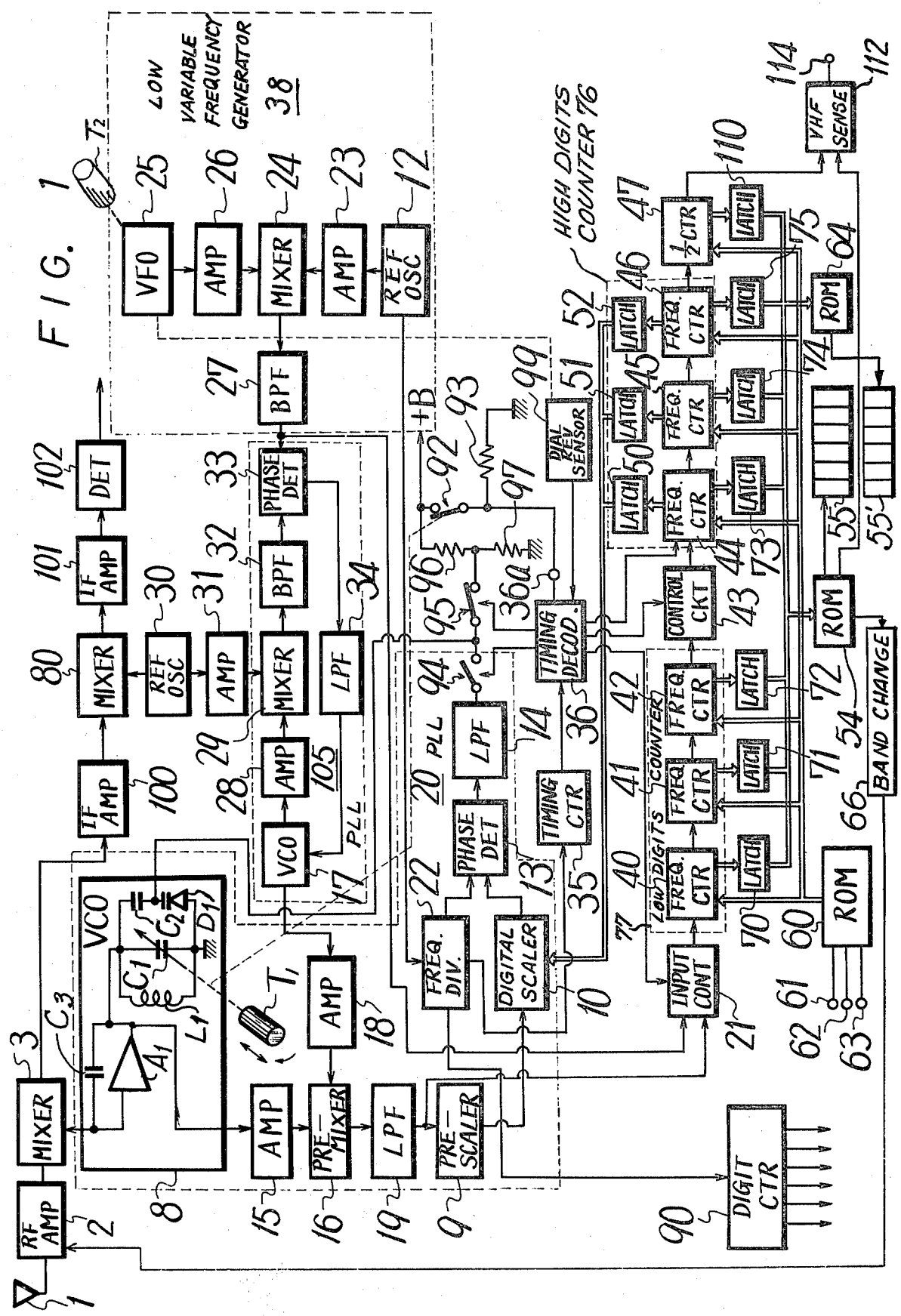
FIG. 1 is a schematic diagram of a multi band radio receiver according to an embodiment of the present invention.

Referring to FIG. 1, a brief functional description will be given of the manner in which coarse and fine tuning of a radio receiver according to the present invention is performed. The functional description will be followed by a detailed description.

The radio receiver according to an embodiment of the invention has an rf amplifier 2 which receives radio signals from an antenna 1 and applies an amplified rf signal to one input of a first mixer 3. A variable local oscillator frequency from a voltage controlled oscillator 8 is applied to a second input of first mixer 3. A first intermediate frequency amplifier 100 amplifies the resulting first intermediate frequency from first mixer 3 and applies the result to an input of a second mixer 80. A fixed reference frequency is applied by a reference oscillator 30 to a second input of second mixer 80. The resulting second intermediate frequency is amplified and detected by a conventional second intermediate frequency amplifier 101 and detector 102 and applied to ensuing radio circuits not shown.

The present invention is capable of operating on any type of rf signal at any low, medium, high, very high and ultra high frequencies and combinations of these. The rf signal may be amplitude or frequency modulated and may have any convenient bandwidth. In addition, although a double conversion process is discussed, it would be clear to one skilled in the art that the invention also encompasses a single conversion receiver. For purposes of description, and solely for the purposes of presenting numerical examples, it is assumed that a radio according to the present invention is a double conversion radio receiver with a received frequency coverage of from 0.1 to 29.99 MHz having a first intermediate frequency of 55.845 MHz and a second intermediate frequency of 455 KHz.

A low variable frequency generator 38, outlined in dashed line, generates a frequency which is manually variable through a range of, for example, 99 KHz from 2.156 to 2.255 MHz. The output of low variable frequency generator 38 is applied to one input of a first phase locked loop 105, outlined in dashed line. A reference oscillator 30 generates a constant frequency signal at 56.3 MHz which is amplified in oscillator 31 and also applied to first phase locked loop 105. First phase locked loop 105 produces a signal which is variable through a range of, for example, 99 KHz from 54.045 to 54.144 MHz under the control of low variable frequency generator 38 and which is phase locked to the output of low variable frequency generator 38.

A second phase locked loop 20, outlined in dashed line, is responsive to the output of the first phase locked loop 105 to control the variable local oscillator frequency generated by voltage controlled oscillator 8 and applied to first mixer 3 in the range of from 55.945 to 85.844 MHz, tuneable over a fine tuning range by variation of the output frequency of the first phase locked loop. Coarse tuning is performed in a separate operation to be described which positions the fine tuning range anywhere within the receiver frequency range of from 0.1 to 29.9 MHz.

During coarse tuning, second phase locked loop 20 is deactivated and a fixed voltage is applied to a frequency determining varactor D1 in voltage controlled oscillator 8. As is well known, varactor D1 has a junction capacitance which is widely variable depending on the magnitude of a bias voltage applied thereto. The junction capacitance of varactor D1 is part of the reactance employed in determining the oscillating frequency of voltage controlled oscillator 8. A manually variable reactance element, such as variable capacitance C1, in voltage controlled oscillator 8 may be manually varied only during coarse tuning to adjust its output frequency to encompass received frequencies over the entire tuning range of the receiver. The output frequencies of low variable frequency generator 38 and first phase locked loop 105 preferably remain unchanged during coarse tuning.

The variable output frequency of voltage controlled oscillator 8 and the fixed output frequency of first phase locked loop 105 are mixed in a premixer 16 and the difference frequency, variable between 1.9 and 3.17 MHz, is applied through an input control circuit 21 to a cascade combination of a three-stage low digits counter 77, outlined in dashed line, and a three-stage high digits counter 76, outlined in dashed line. The low and high digits counters 77 and 76 count the cycles of the signal applied thereto for predetermined time periods to determine therefrom the frequency to which the receiver is tuned. Correction signals from low variable frequency generator 38 and a counter preset read only memory 60 are also applied to counters 77 and 76 to remove errors and biases due to the method of processing which then leaves therein a value representing frequency to which the receiver is tuned. A half counter 47 is included for possible future use of the radio receiver at frequencies exceeding 100 MHz in order to permit reception on, for example, the commercial fm band.

After counting, the high digits counter 76 contains a value representing the three highest digits of the frequency to which the receiver is tuned. In a receiver which has a maximum tuning frequency of about 30 MHz, the three highest digits may be decimal digits representing tens, units and tenths of megahertz. The half digit counter may represent hundreds of megahertz, but is not used in the example system herein described.

The values of the high digits counter 76 are latched by latch circuits 50-52 and are applied to a digital scaler 10 in second phase locked loop 20. Digital scaler 10 is arranged to divide its input frequency by a factor N which is established by the output of high digits counter 76 at the end of coarse tuning.

A band display 55, using conventional display apparatus, receives the outputs of the low and high digits counters 77 and 76 and indicates the band to which the receiver is tuned. As an illustrative example, and not as a limitation, band display 55 may be arranged to display the upper frequency of the band to which the receiver is tuned. The following table may be referred to for one example of the relationship between eight possible frequency bands, their ranges of frequencies and the indication on band display 55 which may be used.

| BAND | TUNING FREQUENCY | INDICATION ON DISPLAY 55 |
|---|---|---|
| LW | 100–400 KHz | 400 |
| $MW_1$ | 400–800 KHz | 800 |
| $MW_2$ | 800–1200 KHz | 1200 |
| $SW_1$ | 1.2–2.0 MHz | 2.0 |
| $SW_2$ | 2.0–4.0 MHz | 4.0 |
| $SW_3$ | 4.0–8.0 MHz | 8.0 |
| $SW_4$ | 8.0–16.9 MHz | 16.0 |

-continued

| BAND | TUNING FREQUENCY | INDICATION ON DISPLAY 55 |
|---|---|---|
| SW₅ | 16.0-29.99 MHz | 30.0 |

At the completion of coarse tuning, the fixed voltage fed to varactor D1 in second phase locked loop 20 is removed and is replaced by an error voltage which is provided by closing phase locked loop 20 through digital scaler 10 which divides its input frequency by the scale factor N which was established and latched during coarse tuning. Therefore, the error signal fed back to varactor D1 is controlled by a frequency which is scaled by the factor N which is established by the high three digits determined during coarse tuning. The error signal fed to varactor D1 controls its junction capacitance in a direction which varies the local oscillator frequency of voltage controlled oscillator 8 toward a frequency which minimizes the error signal.

Upon closing second phase locked loop 20 at the conclusion of coarse tuning, low digits frequency counter 77 measures and stores the lower three digits of the frequency to which the receiver is tuned, for example, in units of tens, units and tenths of kilohertz. Thus, high and low digits counters 76 and 77 together contain the frequency to which the receiver is tuned to the nearest 100 Hz. This frequency is displayed on a conventional frequency display 55'.

When the frequency from low variable frequency generator 38 is changed by 100 Hz or more during normal tuning, a dial revolution sensor 99 detects this fact and enables updating of the frequency display 55'.

An optional band change circuit 66 is effective to select one of a plurality of rf filters (not shown) in rf amplifier 2 corresponding to the frequency stored in the high and low digits counters 76 and 77.

The output of first mixer 3 is the first intermediate frequency of, suitably 55.845 MHz which results from mixing the incoming amplified rf signal at a frequency between 0.1 and 29.99 MHz from rf amplifier 2 with the output frequency of voltage controlled oscillator 8 at a frequency between 55.945 and 85.844 MHz. When amplified in first intermediate frequency amplifier 100 and mixed in mixer 80 with the output of a constant-frequency 56.3 MHz oscillator, the second intermediate frequency of, suitably 455 KHz is produced for further amplification and detection.

This completes the brief functional description of the apparatus shown in FIG. 1. The following paragraphs present a description of the apparatus and its detailed functions in greater detail.

Variable low frequency generator 38 contains a variable frequency oscillator 25 having a variable reactance component (not shown) which may be manually adjusted by operation of the control knob T₂ to adjust its output frequency over a range of 99 KHz from 12.495 to 12.396 MHz. This frequency is amplified in an amplifier 26 and applied to one input of a mixer 24. A reference oscillator 12, which is preferably a crystal controlled oscillator, applies a frequency of, suitably, 10.240 MHz to an amplifier 23 which amplifies a signal and applies it to a second input of mixer 24. The mixed output of mixer 24 is applied to a band pass filter 27 which selects the difference frequency of from 2.255 to 2.156 MHz. This difference frequency is applied to one input of a phase detector 33 in first phase locked loop 105. A voltage controlled oscillator 17 in first phase locked loop 105 generates a signal whose frequency is controlled between 54.045 and 54.144 MHz by a varying dc error signal at its input. The output of voltage controlled oscillator 17 is amplified in an amplifier 28 and applied to one input of a mixer 29. Reference oscillator 30, which is preferably a crystal controlled oscillator, generates a 56.3 MHz frequency which is amplified in an amplifier 31 and applied to a second input of mixer 29. The difference frequency in the output of mixer 29 is selected in a band pass filter 32 and applied to the second input of phase detector 33. Phase detector 33 generates a dc error signal having an amplitude and polarity varying in dependence upon the relationship of the phases of its two input signals. The dc error signal from phase detector 33 is coupled through a low pass filter 34 to the input of voltage controlled oscillator 17 to control its frequency. The frequency output of voltage controlled oscillator 17 is thereby phase controlled in response to the frequency generated by low variable frequency generator 38.

An output from voltage control oscillator 17 is amplified in an amplifier 18 in second phase locked loop 20 and applied to one input of a premixer 16. A variable local oscillator frequency between 55.945 and 85.844 MHz generated in voltage controlled oscillator 8 is amplified in an amplifier 15 and coupled to a second input of premixer 16. The mixed output of premixer 16 is coupled to the input of a low pass filter 19 which selects the difference frequency of its mixed inputs and applies the result of a prescaler 9 which divides its input frequency by a factor of 10. The output frequency of prescaler 9 is therefore from 0.19 to 3.17 MHz depending on the frequency outputs of voltage controlled oscillators 17 and 8.

The prescaled signal from prescaler 9 is applied to a digital scale 10. Digital scaler 10 contains therein a scale factor N by which its input frequency is divided. The scaled output of digital scaler 10 is applied to one input of a phase detector 13. A frequency divider 22 divides the 10.240 MHz output of reference oscillator 12 by a constant factor of 1024 to produce a 10 KHz reference signal which is applied to the second input of phase detector 13. Phase detector 13 produces a dc output signal which represents the phase error between its two inputs. When phase locked loop 20 is operating as a closed loop, the phase error output of phase detector 13 is fed back to varactor D1 in voltage controlled oscillator 8. In response to this error signal, voltage controlled oscillator 8 varies its output such that the scaled signal applied to phase detector 13 becomes and remains exactly 10 KHz. It is clear from this discussion that the frequency from prescaler 9 fed to scaler 10 must also remain constant as long as the scale factor N applied to scaler 10 does not change.

Switches 94 and 95, shown in the positions they assume during coarse frequency tuning, are normally in the reverse positions from those shown. Switch 95 is normally opened and switch 94 is normally closed for normal fine tuning frequency control of the receiver. The phase error signal from phase detector 13 is normally coupled through a low pass filter 14 and the closed contacts of switch 94 to the junction of a capacitor C2 and varactor diode D1 in voltage controlled oscillator 8. Varactor D1 produces a capacitance which is in proportion to the voltage across it. Capacitor C2 and the capacitance of varactor D1 are in series and the series combination is in parallel with an inductor L1. A variable capacitor C1 is also in parallel with inductor L1. Inductor L1 with capacitors C1 and C2 and the capacitance of varactor D1 schematically represent a parallel tuned frequency determining circuit of voltage controlled oscillator 8 whose remaining components are schematically illustrated by an amplifier A1 with a feedback capacitor C3 between its input and output. Variable capacitor C1 is manually adjustable using control knob $T_1$ during coarse tuning as will be explained.

A timing decoder 36 controls the acquisition and processing of signals in low digits counter 77 and high digits counter 76 as well as other functions. A timing counter 35 receives the 10 KHz frequency from frequency divider 22 and produces appropriate timing signals for application to timing decoder 36. These timing signals are employed during coarse and fine tuning to permit changing of the values stored in low and high digits counters 77 and 76.

The 1.9 to 31.7 MHz output of low pass filter 19 is applied to an input of an input control circuit 21. The output of low variable frequency generator 38 is applied to a second input of input control circuit 21. When enabled by a control signal from timing decoder 36, input control circuit 21 couples first one of its inputs then the other of its inputs to its output. The output of input control circuit 21 is coupled to a first frequency counter 40 in low digits counter 77. An output of frequency counter 40 is coupled in cascade to frequency counters 41 and 42 and to the control circuit 43. Frequency counters 40, 41 and 42 may be any type of frequency counter such as binary or octal but are preferably decimal counters wherein frequency counter 40 is operative to count the input frequency in units of 100 Hz, frequency counter 41 is operative to count the frequency in units of 1 KHz and frequency counter 42 is operative to count the frequency in units of 10 KHz. Under the control of signals from timing decoder 36, control circuit 43 couples its input signal from frequency counter 42 to an input of a frequency counter 44 in high digits counter 76. A control signal from timing decoder 36 is also applied to the input of frequency counter 44. Frequency counters 44, 45 and 46 are connected in cascade and are preferably decimal counters operative respectively to count the incoming frequency in units of 100 KHz, 1 MHz and 10 MHz.

Latch circuits 50, 51 and 52 respectively, receiving the outputs of frequency counters 44, 45 and 46, provide a scaling input to digital scaler 10 as will be described. Latch circuits 70-75 receive respectively the outputs of frequency counters 40-42 and 44-46. Latch circuits 70-75 provide inputs to a band read only memory 54 and a frequency read only memory 64. A half counter 47 receives an output from frequency counter 46 and provides an output to a latch circuit 110 which is also connected to band read only memory 54 and frequency read only memory 64. Band read only memory 54 applies control signals to a band display 55 and to a band change circuit 66. Band read only memory 54 contains the relationship between output signals from latch circuits 70-75 and 110 and the corresponding characters to be displayed on band display 55. Upon receiving a particular combination of outputs from latch circuits 70-75 and 110, band read only memory 54 couples appropriate control signals to the input of band display 55 to produce appropriate digits and/or alphabetic data by means well known in the art. Band read only memory 54 also contains the relationship between the outputs from latch circuits 70-75 and 110 and the desired band pass filter (not shown) to be selected in rf amplifier 2.

Band read only memory 54 couples an appropriate control signal to the input of a band change circuit 66 which accomplishes the selection of the appropriate band pass filter in rf amplifier 2 depending upon the frequency detected by low digits counter 77 and high digits counter 76.

Frequency read only memory 64 contains stored therein the relationship between the frequency information in latch circuits 70-75 and 110 and the corresponding alphabetic and/or numeric characters to be displayed on frequency display 55'. A control signal from frequency read only memory 64 to frequency display 55', in response to particular combinations of signals on latch circuits 70-75 and 110, produces a control signal for coupling to frequency display 55' which produces a frequency display defining the frequency to which the receiver is tuned.

A vhf sense circuit 112, not used in the present radio, is included as a growth option for use in later models. The output of half counter 47 is triggered as the number counted in frequency counter 46 exceeds 100 MHz. Thus, half counter 47 provides an input to vhf sense circuit 112 which may be employed together with an input from band read only memory 54 to produce an output on an output line 114, which may be used in circuits (not shown) which give indication of the frequency range, change the frequency or bandwidth of one or more intermediate frequency amplifiers or change the detection mode from, for example, amplitude modulation to frequency modulation.

A digits counter 90 receives a constant frequency input from frequency divider 22. The constant frequency input may be any convenient frequency but is preferably about 80 KHz produced in frequency divider 22 by dividing the 10.240 MHz output of reference oscillator 12 by a factor of 128. Signals on the output lines from digit counter 90 may be employed as driving signals for the individual characters of band display 55 and/or frequency display 55' in a manner well known in the art. In the preferred embodiment, each of six output lines is energized in sequence once every six cycles of the 80 KHz input signal.

A dial revolution sensor 99 is mechanically connected to respond to movement of control knob $T_2$ of variable frequency oscillator 25. Upon detecting movement of control knob $T_2$ sufficient to produce a frequency change from variable frequency oscillator 25 of 100 Hz, dial revolution sensor 99 couples a control signal to timing decoder 36 which enables timing decoder 36 to generate a set of control signals which causes recounting of the frequency to which the receiver is tuned.

A counter preset read only memory 60 contains preset numbers for application to frequency counters 40-42 and 44-46 at appropriate times in the tuning cycle. Input terminals 61, 62 and 63 are used during manufacture of the receiver for selection of a particular set of numbers from a standard part which may contain other numbers not selected for this receiver. For example, one or more of input terminals 61, 62 and 63 may be grounded or have an input voltage applied thereto to configure the standard part for the particular application.

A switch 92 is mechanically connected to control knob $T_1$ as indicated by the dashed lines connecting them. When switch 92 is in the closed condition shown for coarse tuning, a voltage $+B$ is coupled through it and an input terminal 36a to timing decoder 36. The presence of the +B signal at terminal 36a of timing decoder 36 operates switches 94 and 95 into the positions shown. A voltage divider formed of resistors 96 and 97 between the voltage +B and ground produces at the junction thereof a positive voltage which is coupled through the closed contacts of switch 95 to the junction of capacitor C2 and varactor D1 in voltage control oscillator 8. When switch 92 is opened for normal fine tuning by movement of control knob $T_1$ into the normal receiving position at the end of coarse tuning, switch 95 is opened and input terminal 36a of timing decoder 36 is grounded through a resistor 93. The removal of +B from timing decoder 36 reverses the conditions of switches 94 and 95. The opening of switch 95 removes the fixed bias voltage from the junction of capacitor C2 and varactor D1 and the closing of switch 94 applies to the junction of capacitor C2 and varactor D1 a phase error signal from low pass filter 14 thus closing the loop of phase locked loop 20.

Control knobs $T_1$ and $T_2$ are preferably alternately operable. That is, when control knob $T_1$ is operable to close switch 92 and to adjust capacitor C1, control knob $T_2$ is disabled. Similarly, when control knob $T_2$ is operable to control the frequency of variable frequency oscillator 25, control knob $T_1$ is disabled thus keeping capacitor C1 unchanged and opening switch 92.

The following describes the manner in which the apparatus in FIG. 1 accomplishes coarse tuning.

Control knob $T_1$ is manipulated for coarse tuning. Mechanical connection from control knob $T_1$ places switch 92 in the closed position shown. A voltage +B, coupled through closed switch 92 is applied through terminal 36a to timing decoder 36. Timing decoder 36 then places switches 94 and 95 in the coarse tuning conditions shown in FIG. 1. Control knob $T_1$ is connected to variable capacitor C1. Since control knob $T_2$ is preferably disconnected from the control of the variable reactance in variable frequency oscillator 25 during coarse tuning, the output of low variable frequency generator 38 remains constant during coarse tuning at the value previously established by the control knob $T_2$. Since phase locked loop 20 is disabled by the opening of switch 94 and a fixed bias voltage is connected through closed switch 95 to the junction of capacitor C2 and varactor D1 in voltage controlled oscillator 8, the frequency output of voltage controlled oscillator 8 is solely dependent upon the setting of variable capacitor C1 and is not influenced by error signals from phase locked loop 20. As variable capacitor C1 is adjusted to greater or less capacitance to perform coarse adjustment, the output of premixer 16 is variable between 1.9 and 31.7 MHz which is produced by mixing the output of voltage controlled oscillator 8, amplified in amplifier 15 with the output of voltage controlled oscillator 17 amplified in amplifier 18. After passing through low pass filter 19, the resulting frequency of 1.9 to 31.7 MHz is applied to an input of input control circuit 21.

The following analysis defines the relationship between the rf frequency being tuned and the frequencies within the receiver which make it possible to measure and display the rf frequency.

The output $f_N$ of premixer 16 is:

$$f_N = f_1 - f_H \quad (1)$$

Where
$f_1$ = local oscillator frequency from VCO 8
$f_H$ = frequency from VCO 17

The radio frequency to which the receiver is tuned is:

$$f_{rf} = f_1 - f_{IF} \quad (2)$$

Where
$f_{rf}$ = frequency to which receiver is tuned
$f_{IF}$ = IF frequency = 55.845 MHz
Also:

$$f_H = 56.3 \text{ MHz} - f_L \quad (3)$$

Where
$f_L$ = frequency from low variable frequency generator 38

The difference between the frequency $f_N$ from premixer 16 and the rf frequency $f_{rf}$ being tuned is from (1) and (2)

$$f_N - f_{rf} = f_1 - f_H - f_1 + 55.845 \text{ MHz} \quad (4)$$

Substituting (3) into (4) gives:

$$f_N - f_{rf} = -56.3 \text{ MHz} + f_L + 55.845 \text{ MHz}$$
$$= f_L - 0.455 \text{ MHz}$$

Thus,
$$f_N = f_{rf} + f_L - 0.455 \text{ MHz}$$

According to the foregoing, the signal $f_N$ is different from $f_{rf}$ by the variable frequency $f_L$ minus a constant. In order to calculate fhd rf, a constant K is first entered into low and high digits counters 77 and 76 from presetting read only memory 60. Then, these counters are configured as down counters and a number equal to $f_L$ is subtracted from the constant K. This leaves a residue of $(K - f_L)$ in the counters. The constant K is conveniently taken as a number equal to the maximum value of $f_L$, namely 2.2550. Then, a number equal to $f_N$ is added to the residue. This produces a stored value of $$K - f_L + f_{rf} + f_L - 0.455 \times 10^6 = f_{rf} + (2.255 - 0.455) \times 10^6 = f_{rf} + 1.8 \times 10^6$$

Therefore, the number in high and low counters 76 and 77 differs from $f_{rf}$ by a constant. As the final step in the frequency determining process, a constant equal to 018000 is coupled from presetting read only memory 60 to high and low digits counters 76 and 77 where this value is subtracted from the number contained therein. The contents of high and low digits counters 76 and 77, now equal to $f_{rf}$ is latched for storage thereof until the next time the frequency is determined.

Figure 2A:
FIGS. 2A-2D are waveforms to which reference will be made in explaining the operation of the multi band radio receiver of FIG. 1.

Frequency counters 40–42 in low digits counter 77 and frequency counters 44–46 in high digits counter 76 can be placed in either the up counting mode or the down counting mode under control of timing decoder 36. Referring to FIGS. 2A–2D, there is shown the timing relationship of control signals employed in low digits counter 77 and high digits counter 76 for measuring and correcting the received frequency based on the signals generated by low variable frequency generator 38 and voltage controlled oscillator 8. Initially, frequency counters 40–42 and 44–46 are preset with the number K = 022550 and are controlled for down counting. Control signals from timing decoder 36 to input control circuit 21, control circuit 43 and frequency counter 44 control the application of the frequency output of low variable frequency generator 38 to the cascaded combination of frequency counters 40-42 and 44-46 for a 40 millisecond period (FIG. 2A). Input control circuit 21 divides the incoming frequency by a factor of 4 before applying the result to the first frequency counter 40. Consequently, the number of pulses applied to the first frequency counter 40 during the 40 millisecond down counting period of FIG. 2A is equivalent to the number of cycles of the output of low variable frequency generator 38 occurring in 10 milliseconds. It will be noted that if low variable frequency generator 38 is producing its maximum frequency of $f_L = 2.255$ MHz, exactly, 22,550 cycles thereof will be applied by input control circuit 21 to the input of frequency counter 40. In this case, a residue of zero remains in frequency counters 40-42 and 44-46. If low variable frequency generator 38 is producing an output frequency $f_L$ less than its maximum, say 2.205 MHz, (45 KHz below its maximum), at the end of the 40 millisecond counting period in FIG. 2A, frequency counters 40-42 in low digits counter 77 and frequency counters 44-46 in high digits counter 76 contain 000450 i.e. $K - f_L$.

Figure 2B:

A period of 10 milliseconds shown in FIG. 2B following the counting period described above is set aside in the sequence for computation.

Figure 2C:
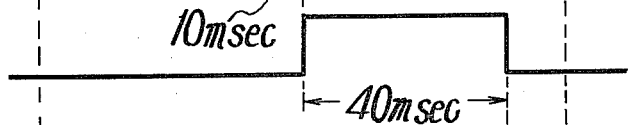
Figure 2D:
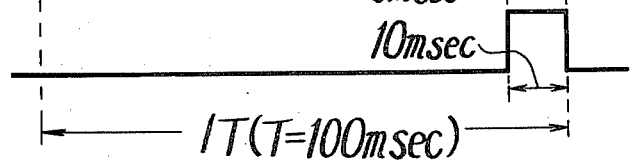

During the second 40 millisecond counting interval shown in FIG. 2C, frequency counters 40-42 and 44-46 receive control signals from timing decoder 36 which place them in the up counting mode. Input control circuit 21 divides the signal $f_N$ by 4 and applies the result of the input of low digits counter 77. Frequency counters 40-42 and 44-6 add the signal $f_N$, divided by 4 in input control circuit 21 to the residue from the down counting operation for the 40 millisecond second counting period in FIG. 2C. Storage of $f_N/4$ for 40 milliseconds is equivalent to storage of $f_N$ for 10 milliseconds. Thus, the numerical value stored is $f_N$ in MHz $\times 10^4$. As was previously noted, the number stored at this time equals $f_{rf}$ plus a fixed bias error equal to 1.8 MHz. During the 10 millisecond second computing period shown in FIG. 2D, the number 018000 is coupled to frequency counters 40-42 and 44-46 by presetting read only memory 60 and is subtracted from the content thereof. This removes the 1.8 MHz fixed bias error, thus leaving a number equal to the rf signal being tuned.

At the end of coarse tuning, the resulting values in frequency counters 44-46 are latched in latch circuits 50, 51 and 52 which apply a scale factor N to digital scaler 10 which is later used for closed loop operation of phase locked loop 20.

The values in frequency counters 40-42 and 44-46 are also latched in latch circuits 73, 74 and 75 and applied to band read only memory 54. Band read only memory 54 contains information which relates the measured frequency and the corresponding characters to be displayed on the band display. Band read only memory 54 applies a signal to band display 55 for producing a display indication usable by the operator to determine the band being tuned.

At the conclusion of coarse tuning, control knob $T_1$ is moved from a position which mechanically couples it to capacitor C1 and closes switch 92 to a position which disconnects it from capacitor C1 and opens switch 92. At this time, control knob $T_2$ is mechanically connected to a variable reactance within variable frequency oscillator 25. The opening of switch 92 causes switches 94 and 95 to reverse their positions from the positions shown and thereby to close second phase locked loop 20 which thereupon is controlled through scaler 10 which now employs the scale factor N being provided by latch circuits 50, 51 and 52 in high digits counter 76. The removal of the +B signal at terminal 36a of timing decoder 36 causes timing decoder 36 to produce a second sequence of timing signals similar to FIGS. 2A-2D to again count the frequency at the input of input controller 21 to now accommodate the fact that second phase locked loop 20 is closed. At the conclusion of this sequence, latch circuits 70-75 and 110 provide outputs to frequency read only memory 64 which contains the relationship between measured frequencies and characters to be displayed. Frequency read only memory 64 applies control signals to frequency display 55' which thereupon displays the actual frequency to which the receiver is tuned.

As long as no further frequency adjustments are made, no further control signals are generated by timing decoder 36 and the frequency numbers latched into latches 70-75 and 110 as well as latches 50-52 remain unchanged. If the control knob in position $T_2$ is rotated, its motion is mechanically coupled to dial revolution sensor 99. Dial revolution sensor 99 is sensitive to motion of control knob $T_2$ sufficient in magnitude to change the tuning frequency of the receiver by 100Hz. Upon detecting such motion, dial revolution sensor 99 couples a control signal to timing decoder 36 which thereupon generates a set of control signals such as shown in FIGS. 2A-2D to update the frequency display. When control knob $T_2$ again becomes stationary and the updating is completed, the frequency counting and display circuits resume their latched conditions.

Control knobs $T_1$ and $T_2$ may be separate knobs independently capable of controlling their respective reactance elements but in the preferred embodiment they are a single knob having a first position $T_1$ for example, pulled outward from the panel of the radio and a second position $T_2$, for example, pushed toward the panel of the radio. In the first position corresponding to $T_1$, the control knob is effective to close switch 92 and to manually vary capacitor C1. In the second position corresponding to $T_2$, it is effective to open switch 92, ineffective to manually vary capacitor C1 but is effective to vary the reactance in variable frequency oscillator 25. This arrangement is especially convenient because all tuning and switching is performed using a single knob.

Having described the specific illustrative embodiment of the invention with reference to the accompanying drawings, it is to be understood that the invention is not limited to this precise embodiment and that various changes and modifications may be effected therein by one skilled in the art without departing from the spirit or scope of the invention as defined in the appended claims.

What is claimed is:

1. Apparatus for producing a variable local oscillator frequency signal for use in a radio receiver comprising: controllable means for generating a variable frequency signal; phase locked loop means for generating said variable local oscillator frequency signal including mixer means for mixing signals related to said variable frequency signal and said variable local oscillator signal to produce a third frequency signal, scaler means for dividing said third frequency signal by a changeable scale factor to produce a fourth frequency signal, and error signal generating means for generating an error signal in response to said fourth frequency signal varying from a reference frequency said error signal controlling said phase locked loop generated variable local oscillator signal; and scale factor determining means, for producing said changeable scale factor in relation to at least one of the frequencies of said variable frequency signal and said third frequency signal, including a plurality of frequency counters in cascade and input control means operative for gating a signal related to said third frequency signals into said plurality of frequency counters for a predetermined time, and further operative for gating a signal related to said variable frequency signal into said plurality of frequency counters for a second predetermined time.

2. Apparatus for producing a variable local osciilator frequency signal for use in a radio receiver comprising: controllable means for generating a variable frequency signal; phase locked loop means for generating said variable local oscillator frequency signal including mixer means for mixing signals related to said variable frequency signal and said variable local oscillator signal to produce a third frequency signal, scaler means for driving said third frequency signal by a changeable scale factor to produce a further frequency signal, and error signal generating means for generating an error signal in response to said fourth frequency signal varying from a reference frequency said error signal controlling said phase locked loop generated variable local oscillator signal; and scale factor determining means for producing said changeable scale factor in relation to at least one of the frequencies of said variable frequency signal and said third frequency signal, including a plurality of frequency counters which are operative in response to control signals to function alternatively as up counters and down counters, control means for presetting said plurality of frequency counters, for applying a signal related to one of said third frequency signal and said variable frequency signal to said plurality of frequency counters and for controlling said plurality of frequency counters as down counters for a first predetermined time whereby a residue number remains in said plurality of frequency counters at the end of said first predetermined time, said control means being further operative for applying a signal related to the other of said third frequency signal and said variable frequency signal to said plurality of frequency counters for a second predetermined time after said first predetermined time and for controlling said plurality of frequency counters as up counters whereby a number is added to said residue number to produce a factor which is related to said changeable scale factor by a predetermined constant, and means for applying said constant to said factor to produce said changeable scale factor.

3. Apparatus according to claim 2; further comprising display means for displaying said changeable scale factor.

4. Apparatus according to claim 3, wherein said changeable scale factor represents a frequency to which said radio receiver is tuned.

5. Apparatus according to claim 3; wherein said display means includes storage means for relating said changeable scale factor to a frequency band and for displaying characters which identify said frequency band.

6. Apparatus according to claim 3; wherein said display means includes storage means for relating said changeable scale factor to the frequency to which said receiver is tuned, said display means being operative to display said frequency.

7. Apparatus for producing a variable local oscillator frequency signal for use in a radio receiver comprising: controllable means for generating a variable frequency signal; phase locked loop means for generating said variable local oscillator frequency signal including mixer means for mixing signals related to said variable frequency signal and said variable local oscillator signal to produce a third frequency signal, scaler means for dividing said third frequency signal by a changeable scale factor to produce a fourth frequency signal, and error signal generating means for generating an error signal in response to said fourth frequency signal varying from a reference frequency said error signal controlling said phase locked loop operated variable local oscillator signal; and scale factor determining means for producing said changeable scale factor in relation to at least one of the frequencies of said variable frequency signal and said third frequency signal; said controllable means including a low variable frequency generator operative to generate a low variable frequency signal, another phase locked loop, and a reference oscillator operative to generate a reference frequency signal, said other phase locked loop being responsive to said low variable frequency signal and said reference frequency signal to generate said variable frequency signal.

8. A radio receiver comprising: an rf amplifier; a mixer for receiving rf signals from said rf amplifier; controllable frequency generating means for generating a variable frequency signal; a phase locked loop including a voltage controlled oscillator which is effective to generate a variable local oscillator signal for application to said mixer whereby an intermediate frequency signal is produced, mixer means for mixing said variable frequency signal and said variable local oscillator signal to produce a third frequency signal, scaler means for dividing said third frequency signal by a changeable scale factor, and error signal means responsive to the difference between a signal from said scaler means and a reference signal for producing, as an error signal, a control voltage fed back to control the frequency of said voltage controlled oscillator; and scale factor generating means responsive to at least one of the frequencies of said variable frequency signal and said third frequency signal to generate said changeable scale factor, including a plurality of frequency counters in cascade, means for adding a number to the content of said plurality of frequency counters which is related to the frequency of said third frequency signal, presetting means for presetting said plurality of frequency counters to preset conditions, and means for subtracting a number from the content of said plurality of frequency counters which is related to the frequency of said variable frequency signal, the number remaining in said plurality of frequency counters representing a radio frequency to which said radio receiver is tuned, and said changeable scale factor being at least part of the content of said plurality of frequency counters.

9. A radio receiver comprising: an rf amplifier; a mixer for receiving rf signals from said rf amplifier; controllable frequency generating means for generating a variable frequency signal; a phase locked loop including a voltage controlled oscillator which is effective to generate a variable local oscillator signal for application to said mixer whereby an intermediate frequency signal is produced, mixer means for mixing said variable frequency signal and said variable local oscillator signal to produce a third frequency signal, scaler means for dividing said third frequency signal by a changeable scale factor, and error signal means responsive to the difference between a signal from said scaler means and a reference signal for producing, as an error signal, a control voltage fed back to control the frequency of said voltage controlled oscillator; and scale factor generating means responsive to at least one of the frequencies of said variable frequency signal and of said third frequency signal to generate said changeable scale factor; in which said controllable frequency generating means includes a manually variable control, and sensor means for sensing that said control is varied at least a predetermined amount and for generating a signal in response thereto; and in which said scale factor generating means is responsive to said signal from the sensor means to update at least part of the content of said plurality of frequency counters whereby the content of said frequency counters continues to represent a radio frequency to which said radio receiver is tuned.

10. A radio receiver comprising: an rf amplifier; a mixer for receiving rf signals from said rf amplifier; controllable frequency generating means for generating a variable frequency signal; a phase locked loop including a voltage controlled oscillator which is effective to generate a variable local oscillator signal for application to said mixer whereby an intermediate frequency signal is produced, mixer means for mixing said variable frequency signal and said variable local oscillator signal to produce a third frequency signal, scaler means for dividing said third frequency signal by a changeable scale factor, and error signal means responsive to the difference between a signal from said scaler means and a reference signal for producing, as an error signal, a control voltage fed back to control the frequency of said voltage controlled oscillator; scale factor generating means responsive to at least one of the frequencies of said variable frequency signal and of said third frequency signal to generate said changeable scale factor; and coarse tuning means including means for replacing said error signal with a fixed voltage, and manually controllable means for adjusting the frequency of said voltage controlled oscillator.

11. A radio receiver according to claim 10; wherein said scale factor generating means includes latch means for storing said changeable scale factor only during operation of said coarse tuning means.

12. A radio receiver comprising: an rf amplifier; a mixer for receiving rf signals from said rf amplifier; a phase locked loop; a voltage controlled oscillator in said phase locked loop, said voltage controlled oscillator being operative to produce a variable local oscillator frequency signal for application to said mixer whereby an intermediate frequency signal is produced; a variable frequency generator operative to produce a variable frequency signal; a premixer in said phase locked loop to which said variable local oscillator frequency signal and said variable frequency signal are applied and which produces a third frequency signal; a scaler in said phase locked loop operative to divide said third frequency signal by a changeable scale factor N to produce a scale signal; a phase detector in said phase locked loop operative to produce a dc error signal in response to a phase difference between said scaled signal and a reference frequency; means for feeding said error signal back to said voltage controlled oscillator whereby said scaled signal is maintained at a substantially constant frequency; coarse tuning means for temporarily disabling said phase locked loop and for replacing said error signal with a constant dc voltage; a plurality of frequency counters in cascade; means for storing a number in said frequency counters during coarse tuning which is related to said third frequency signal; means for removing from the number stored in said plurality of frequency counters any influence on said third frequency signal caused by said variable frequency signal; presetting means for correcting the number remaining in said plurality of frequency counters whereby the corrected number represents digits of an rf frequency to which said radio receiver is tuned; latch means for storing at least some of said digits at the end of coarse tuning and for applying them to said scaler means; updating means for updating the content of said plurality of frequency counters during fine tuning; display means for displaying characters representing the content of said plurality of frequency counters.

13. A multi band radio receiver comprising: a mixer receiving an rf signal to be tuned at a first input thereof; local oscillator means having a tuning range for supplying a second input of said mixer with a local oscillator signal having a frequency related to the frequency of said rf signal whereby an intermediate frequency signal is produced; a manually variable frequency controlling element in said local oscillator means; a voltage variable frequency controlling element in said local oscillator means; a phase locked loop which includes said local oscillator means; scaler means in said phase locked loop for dividing a signal related to said local oscillator signal by a predetermined scale factor to produce a scaled signal; a phase detector operative to generate an error signal in response to a difference in phase between said scaled signal and a reference signal; feedback means for feeding said error signal back to said voltage variable frequency controlling element whereby said scaled signal is controlled to have a frequency equal to said reference signal; coarse tuning means for interrupting said feedback means and for applying a constant voltage to said voltage variable frequency controlling element; said coarse tuning means also being operative to permit manual control of said manually variable frequency controlling element whereby channel selection is enabled; frequency counter means supplied with a frequency related to said local oscillator signal for measuring the frequency of the signal supplied thereto; and scale factor controlling means for controlling the scale factor in said scaler means in accordance with the content of said frequency counter means.

14. A multi band radio receiver according to claim 13; wherein said frequency counter means includes a plurality of up-down counters each operative to contain a digit of a counted frequency and said scale factor controlling means employs the content of at least some of said up-down counters.

15. A multi band radio receiver according to claim 13; further comprising a frequency mixer between said local oscillator means and said scaler means, a variable frequency oscillator producing a variable frequency signal having a range of variation which covers a fine tuning range and said variable frequency signal being applied to said frequency mixer.

16. A multi band radio receiver according to claim 15; further comprising means for correcting the content of said frequency counter means to make said content represent the frequency of a received rf signal and display means for displaying the frequency of said received rf signal.

17. A multi band radio receiver according to claim 16; wherein said scale factor controlling means and said display means include means for time sharing the operation thereof whereby both means can employ the same frequency counter means.

18. A multi band radio receiver according to claim 15; wherein said tuning range is sufficient to permit reception over at least a medium and a short wave band.

19. A multi band radio receiver according to claim 18; further comprising a second conversion mixer to one input of which said intermediate frequency signal is applied and a reference oscillator operative to generate a reference frequency signal for application to a second input of said second conversion mixer whereby a second intermediate frequency is produced.

* * * * *